(12) United States Patent
Machita et al.

(10) Patent No.: US 7,929,257 B2
(45) Date of Patent: Apr. 19, 2011

(54) MAGNETIC THIN FILM HAVING SPACER LAYER THAT CONTAINS CUZN

(75) Inventors: Takahiko Machita, Tokyo (JP); Tomohito Mizuno, Tokyo (JP); Yoshihiro Tsuchiya, Tokyo (JP); Daisuke Miyauchi, Tokyo (JP); Shinji Hara, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 731 days.

(21) Appl. No.: 11/678,506

(22) Filed: Feb. 23, 2007

(65) Prior Publication Data
US 2008/0204942 A1 Aug. 28, 2008

(51) Int. Cl.
*G11B 5/39* (2006.01)
*H04R 31/00* (2006.01)

(52) U.S. Cl. .............. 360/324.1; 29/603.06; 29/603.13

(58) Field of Classification Search .............. 360/324.1; 29/603.08, 603.07, 603.13
See application file for complete search history.

(56) References Cited

U.S. PATENT DOCUMENTS

| | | | | |
|---|---|---|---|---|
| 6,937,446 | B2* | 8/2005 | Kamiguchi et al. | 360/324.1 |
| 7,525,772 | B2* | 4/2009 | Funayama et al. | 360/314 |
| 2005/0002126 | A1* | 1/2005 | Fujiwara et al. | 360/324.1 |
| 2005/0052787 | A1* | 3/2005 | Funayama et al. | 360/314 |
| 2005/0094327 | A1* | 5/2005 | Okuno et al. | 360/324.2 |
| 2005/0152076 | A1* | 7/2005 | Nagasaka et al. | 360/324.1 |
| 2006/0050444 | A1* | 3/2006 | Fukuzawa et al. | 360/324 |
| 2006/0098353 | A1* | 5/2006 | Fukuzawa et al. | 360/324.1 |
| 2006/0181814 | A1* | 8/2006 | Koui et al. | 360/324.1 |
| 2007/0097558 | A1* | 5/2007 | Carey et al. | 360/324.1 |
| 2007/0188936 | A1* | 8/2007 | Zhang et al. | 360/324.1 |
| 2007/0188945 | A1* | 8/2007 | Fuji et al. | 360/324.12 |
| 2008/0192388 | A1* | 8/2008 | Zhang et al. | 360/324 |

FOREIGN PATENT DOCUMENTS

| | | |
|---|---|---|
| JP | 08-250366 | 9/1996 |
| JP | 2004-153248 | 5/2004 |
| JP | 2006-135253 | 5/2006 |

OTHER PUBLICATIONS

"Hafnium", printed from WebElements website on Dec. 17, 2009.*

* cited by examiner

*Primary Examiner* — Julie Anne Watko
(74) *Attorney, Agent, or Firm* — Knobbe, Martens, Olson & Bear, LLP

(57) ABSTRACT

A magnetic thin film has a pinned layer whose magnetization direction is fixed with respect to an external magnetic field, a free layer whose magnetization direction is changed according to the external magnetic field, and a spacer layer which is sandwiched between said pinned layer and said free layer. Sense current is configured to flow in a direction that is perpendicular to film surfaces of said pinned layer, said spacer layer, and said free layer. Said spacer layer has a CuZn metal alloy which includes an oxide region, said oxide region consisting of an oxide of any of Al, Si, Cr, Ti, Hf, Zr, Zn, and Mg.

21 Claims, 8 Drawing Sheets

MAGNETIC THIN FILM HAVING SPACER LAYER THAT CONTAINS CUZN

BACKGROUND OF THE INVENTION

1. Field of the Invention

The present invention relates to a magnetic thin film that is used for a CPP-GMR (Current Perpendicular to the Plane Giant Magneto Resistance) element (hereinafter called a "CPP element") which constitutes a thin-film magnetic head, and more particularly relates to the structure of a spacer layer.

2. Description of the Related Art

A CPP element is known as one of the magnetic field detecting elements which are used in a thin-film magnetic head. A CPP element has a pinned layer whose magnetization direction is fixed with respect to an external magnetic field, a free layer whose magnetization direction is changed in accordance with the external magnetic field, and a non-magnetic spacer layer that is sandwiched between the pinned layer and free layer (also called a "spacer layer"). In this specification, a stacked structure of layers that are comprised of a pinned layer, a non-magnetic spacer layer, and a free layer is called a "magnetic thin film." A magnetic thin film is a central part of a CPP element for generating a change in magneto resistance by the GMR effect. The magnetic thin film forms a stacked structure of layers, which is referred to as a spin valve (hereinafter, referred to as a SV), together with other metallic layers. Sense current is configured to flow in a direction that is perpendicular to the film surfaces of the SV, i.e., the pinned layer, the spacer layer, and the free layer. A SV is sandwiched between a pair of shield layers. The shield layers functions as electrode layers for supplying sense current, as well as functions as a magnetic shield for the SV. In a CPP element, since the SV is physically connected with the shield layers, the CPP element has a high efficiency for heat radiation, and a large capacity for sense current. Further, the CPP element exhibits a larger electric resistance and a larger change in resistance in accordance with a decrease in cross section. Accordingly, the CPP element is more suitable for a narrow track width.

The SV in a CPP element is usually formed of metallic material because sense current flows in a direction that is perpendicular to the SV. Accordingly, electric resistance is significantly small. If electric resistance is small, then a change in electric resistance becomes small, and it is impossible to achieve a large MR ratio. For this reason, various techniques for increasing electric resistance have been disclosed. The specification of Japanese Patent Laid-Open Publication No. 2006-135253 discloses a technique to provide a region having large electric resistance and a region having small electric resistance in a spacer layer. Since most sense current flows through the region of smaller electric resistance, an effect can be achieved that is similar to the effect that would be obtained when the cross-section of the element is actually reduced, and increased electric resistance can be obtained. The region of small resistance is formed of Cu, Ag, Au, Pt, or the like. The region of large resistance is formed of oxide of Al, Mg, or the like. The specification of Japanese Patent Laid-Open Publication No. 2004-153248 discloses a technique to form a similar large resistance region and a small resistance region by using phase separation of metal alloy.

However, even a CPP element having a spacer layer that is provided with a region of large resistance and a region of small resistance, as mentioned above, does not exhibit a sufficiently large MR ratio in a low RA region. The RA value means a product of electrical resistance R of a SV to sense current and the minimum cross sectional area A that is taken in the plane of a film surface of the SV. When the RA value is large, S/N ratio is significantly reduced due to shot noises. Therefore, the RA value is preferably $0.35(\Omega\ \mu m^2)$ or less when the CPP element is applied to a magnetic head. However, when the RA value is $0.35(\Omega\ \mu m^2)$ or less, the MR ratio is in a range of as low as 4 to 5%. There is a need to further improve the MR ratio in order to put a head having 400 Gpsi or more to practical use.

SUMMARY OF THE INVENTION

An object of the present invention is to provide a magnetic thin film that is capable of exhibiting a large MR ratio. Another object of the present invention is to provide a thin film magnetic head, a slider, a hard disk drive etc. using the same.

According to an embodiment of the present invention, a magnetic thin film comprises a pinned layer whose magnetization direction is fixed with respect to an external magnetic field, a free layer whose magnetization direction is changed according to the external magnetic field, and a spacer layer which is sandwiched between said pinned layer and said free layer.

Sense current is configured to flow in a direction that is perpendicular to film surfaces of said pinned layer, said spacer layer, and said free layer. Said spacer layer comprises a CuZn metal alloy which includes an oxide region, said oxide region consisting of an oxide of any of Al, Si, Cr, Ti, Hf, Zr, Zn, and Mg.

The spacer layer is conventionally formed of materials having small specific resistance, such as Cu, Au, and Ag. This is based on the consideration that spin information is apt to be lost in a material having large specific resistance due to the generally short spin diffusion length and that this makes it difficult to obtain the GMR effect. The inventors of the present invention have found that both long spin diffusion length and large specific resistance can be simultaneously achieved by replacing Cu with CuZu and by adding oxide of any of Al, Si, Cr, Ti, Hf, Zr, Zn, and Mg to the CuZn layer. As a result, a sufficient GMR effect, as well as a large change in electric resistance, can be achieved. Accordingly, it is possible to achieve an increased MR ratio.

According to another embodiment of the present invention, a method for manufacturing a magnetic thin film is provided, wherein said magnetic thin film comprises a pinned layer whose magnetization direction is fixed with respect to an external magnetic field, a free layer whose magnetization direction is changed according to the external magnetic field, and a spacer layer which is sandwiched between said pinned layer and said free layer, wherein sense current is configured to flow in a direction that is perpendicular to film surfaces of said pinned layer, said spacer layer, and said free layer. The method for manufacturing the magnetic thin film comprising the steps of: forming either said pinned layer or said free layer; forming an electrically conductive layer which consists of a CuZn metal alloy on said magnetic layer as part of said spacer layer; forming a material body on said electrically conductive layer, said material body consisting of any of Al, Si, Cr, Ti, Hf, Zr, Zn, and Mg; oxidizing said material body and forming an oxide region as part of said spacer layer, said oxide region consisting of oxide of any of Al, Si, Cr, Ti, Hf, Zr, Zn, and Mg; and forming the other said pinned layer or free layer on said electrically conductive layer which is provided with said oxide region.

A thin film magnetic head according to the present invention comprises a said magnetic thin film mentioned above.

A slider according to the present invention comprises said thin film magnetic head mentioned above.

A wafer according to the present invention has said magnetic thin film mentioned above that is formed thereon.

A head gimbal assembly according to the present invention comprises said slider mentioned above, and a suspension for resiliently supporting said slider.

A hard disk drive according to the present invention comprises said slider mentioned above, and a device for supporting said slider and for positioning said slider with respect to a recording medium.

The above and other objects, features and advantages of the present invention will become apparent from the following description with reference to the accompanying drawings which illustrate examples of the present invention.

DESCRIPTION OF THE PREFERRED EMBODIMENTS

With reference to the drawings, embodiments of the present invention in which a magnetic thin film is applied to a thin film magnetic head of a hard disk drive will be described. The magnetic thin film of the present invention may also be applied to a magnetic memory element and a magnetic sensor assembly and so on.

First Embodiment

Figure 1:
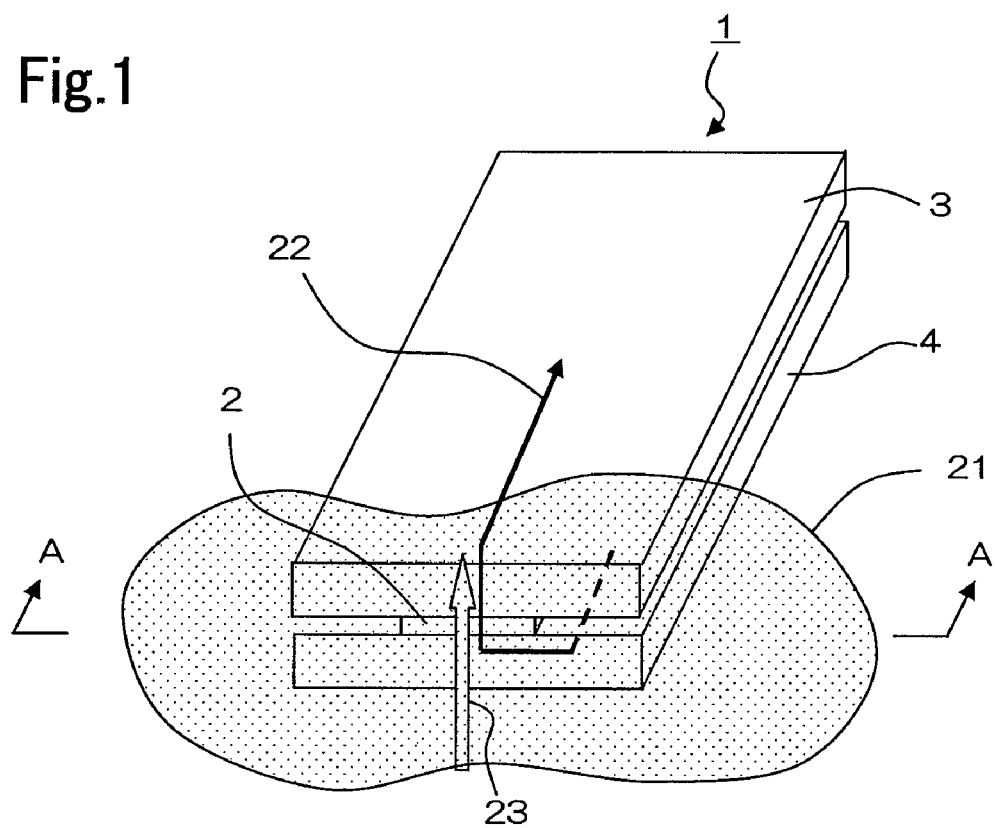
FIG. 1 is a partial perspective view of a thin film magnetic head.

FIG. 1 is a partial perspective view of a thin film magnetic head having a magnetic thin film of the present invention. Thin-film magnetic head 1 may be a read only head, or may be an MR/inductive composite head which additionally has a write head portion. SV 2 is sandwiched between upper electrode/shield 3 and lower electrode/shield 4, and the leading end thereof is disposed opposite to recording medium 21. SV 2 is configured such that sense current 22 flows in a direction that is perpendicular to the film surfaces under a voltage that is applied between upper electrode/shield 3 and lower electrode/shield 4. The magnetic field of recording medium 21 at a position opposite to SV 2 is changed in accordance with the movement of magnetic medium 21 in moving direction 23. Thin film magnetic head 1 detects the change in magnetic field as a change in electric resistance based on the GMR effect, and reads magnetic information that is written in each magnetic domain of recording medium 21.

Figure 2:
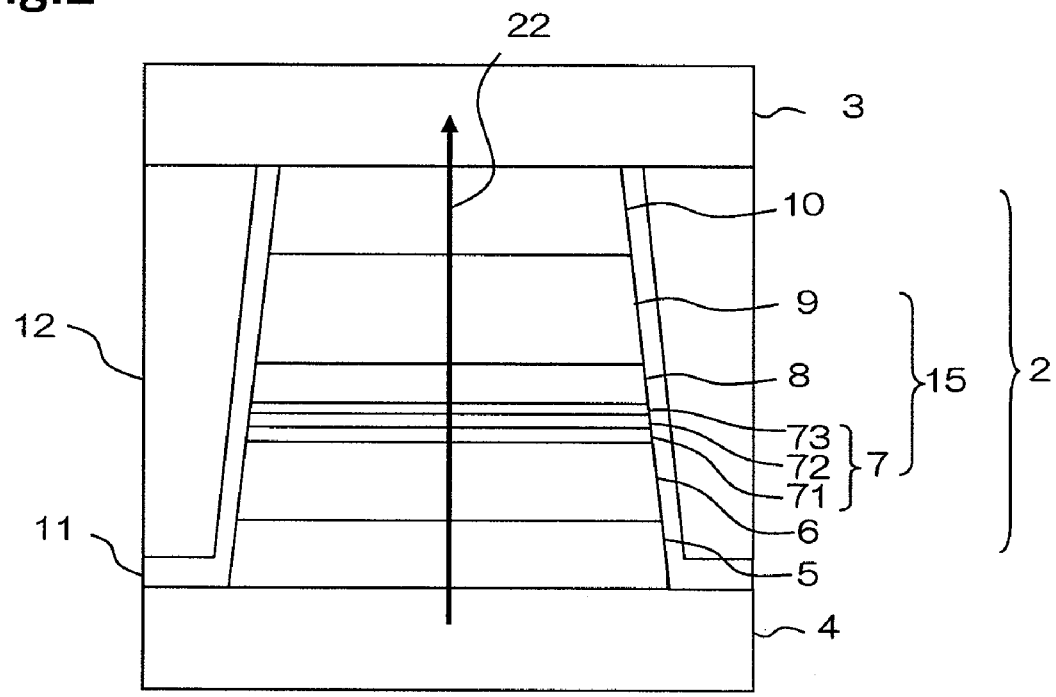
FIG. 2 is a side view of the SV that is included in the thin film magnetic head shown in FIG. 1.

FIG. 2 is a side view of the SV viewed from A-A direction in FIG. 1, i.e., from the air bearing surface. The air bearing surface refers to a surface of thin-film magnetic head 1 which is opposite to recording medium 21. Table 1 shows an exemplary layer configuration of SV 2. Table 1 shows the layers in the order of stacking from buffer layer 5 at the bottom row, which is in contact with lower electrode/shield 4, to cap layer 10 at the top row, which is in contact with upper electrode/shield 3.

TABLE 1

| Layer Configuration | | Composition | Layer Thickness (nm) |
|---|---|---|---|
| Cap Layer 10 | | Ru | 2 |
| Free Layer 9 | | CoFe | 4 |
| Spacer Layer 8 | | CuZn + Al$_2$O$_3$ | 2.1~2.4 |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

SV 2 is a stacked structure in which buffer layer 5, antiferromagnetic layer 6, pinned layer 7, spacer layer 8, free layer 9, and cap layer 10 are stacked in this order on lower electrode/shield 4, which is made of a NiFe layer and which has a thickness of approximately 1 μm. Pinned layer 7, spacer layer 8, and free layer 9 constitute magnetic thin film 15. Pinned layer 7 is a layer whose magnetization direction is fixed with respect to an external magnetic field. Free layer 9 is a layer whose magnetization direction is changed in accordance with the external magnetic field. Sense current 22 flows in the direction that is perpendicular to the film surfaces of pinned layer 7, spacer layer 8, and free layer 9, i.e., SV 2. The magnetization direction of free layer 9 forms an angle relative to the magnetization direction of pinned layer 7 in accordance with the external magnetic field. Spin dependent scattering of conduction electrons is varied in accordance with the relative angle, and a change in magneto resistance is caused. Thin-film magnetic head 1 detects the change in magneto resistance so that it reads magnetic information on a recording medium.

Pinned layer 7 is constructed as a so-called synthetic pinned layer. Specifically, pinned layer 7 has outer pinned layer 71, inner pinned layer 73 that is disposed closer to spacer layer 8 than outer pinned layer 71, and spacer layer 72 that is sandwiched between outer pinned layer 71 and inner pinned layer 73. The magnetization direction of outer pinned layer 71 is fixed due to exchange coupling with anti-ferromagnetic layer 6. Further, inner pinned layer 73 is anti-ferromagnetically coupled to outer pinned layer 71 via spacer layer 72. Thus, the magnetization direction of inner pinned layer 73 is firmly fixed. In this way, in the synthetic pinned layer, a stable magnetization state is maintained in pinned layer 7, and effective magnetization of pinned layer 7 is limited as a whole.

Figure 3:
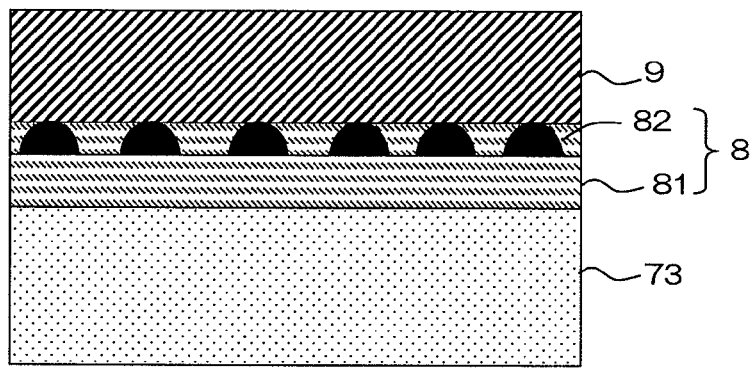
FIG. 3 is an enlarged view of the spacer portion of the thin film magnetic head shown in FIG. 1.

Referring to FIG. 3, spacer layer 8 has a construction in which oxide region 82 having oxide of Al (aluminum) is included in the CuZn metal alloy that constitutes electrically conductive layer 81. Oxide region 82 functions as an insulating layer and has a larger electric resistance than electrically conductive layer 81. Therefore, sense current 22 mainly flows in electrically conductive layer 81, and thus, a similar effect is obtained in which the cross section through which sense current 22 flows is reduced as compared with a configuration that does not have oxide region 82.

Buffer layer 5 is provided to ensure sufficient exchange coupling of anti-ferromagnetic layer 6 with outer pinned layer 71. Cap layer 10 is provided to prevent deterioration of each of the stacked layers. Upper electrode/shield 3, which is made of a NiFe film and is approximately 1 μm thick, is formed on cap layer 10.

Hard bias films 12 are formed on the sides of SV 2 via insulating films 11. Hard bias film 12 is a magnetic domain control film for placing free layer 9 in the state of a single magnetic domain. Insulating film 11 is made of $Al_2O_3$, and hard bias film 12 is made of CoPt, CoCrPt, or the like.

Spacer layer 8, which is the characteristic feature of the present invention, will be further described. The MR ratio is represented by dR/R, where dR is a change in electrical resistance and R is electric resistance of SV 2. R is equal to (electric resistance R' of magnetic thin film 15)+(electric resistance R" of the remaining portions of SV 2). In the present embodiment, the remaining portions of SV 2 mean buffer layer 5, anti-ferromagnetic layer 6, and cap layer 10. Since it is magnetic thin film 15 that produces a change in electric resistance based on the magnetic resistance effect, the change in electric resistance dR is equal to an increment or a decrement of electric resistance R' of magnetic thin film 15. Electric resistance R", which is also called parasitic resistance, does not contribute to the MR ratio. From the foregoing, it will be understood that it is important to increase the ratio of electric resistance R' of magnetic thin film 15 to electric resistance R of SV 2 in order to increase the MR ratio.

In the present embodiment, electric resistance R' is increased for the two reasons below. The first reason is that spacer layer 8 is provided with oxide region 82. Since sense current 22 is less liable to flow in oxide region 82 due to large resistance, electric resistance R' is increased. The second reason is that electrically conductive layer 81 is comprised of CuZn metal alloy. CuZn metal alloy has a larger specific resistance than Cu. Specifically, the specific resistance of Cu60Zn40 is 3.1 times larger than that of Cu. In other words, electric resistance R' of magnetic thin film 15 is also increased by using CuZn metal alloy. Incidentally, the numeral that follows the atomic symbol indicates an atomic fraction.

Further, the inventors think that CuZn allows a sufficient spin diffusion length to be kept. This means that conduction electrons pass through spacer layer 8 without spin information thereof being lost, and therefore, sufficient GMR effect is obtained. In general, if an electrically conductive layer has large resistance, then the spin diffusion length tends to be decreased. However, the inventors of the present application have found that CuZn realizes both long spin diffusion length and large specific resistance simultaneously.

As described above, a large MR ratio can be achieved by using CuZn metal alloy for electrically conductive layer 81 of spacer layer 8 and by providing spacer layer 8 with oxide region 82.

Oxide region 82 is not limited to oxide of Al as long as it has large resistance and characteristics to direct sense current 22 to electrically conductive layer 81. For instance, oxide region 82 may be formed of oxide of any of Si, Cr, Ti, Hf, Zr, Zn, and Mg, or a mixture thereof.

The CPP element of the present embodiment is a bottom type in which the pinned layer is deposited prior to the free layer. However, the present invention can similarly be applied to a top type CPP element in which the free layer is deposited prior to the pinned layer. Also, the pinned layer does not have to be a synthetic pinned layer, and a single-layer pinned layer without using anti-ferromagnetic coupling may be used.

Figure 4:
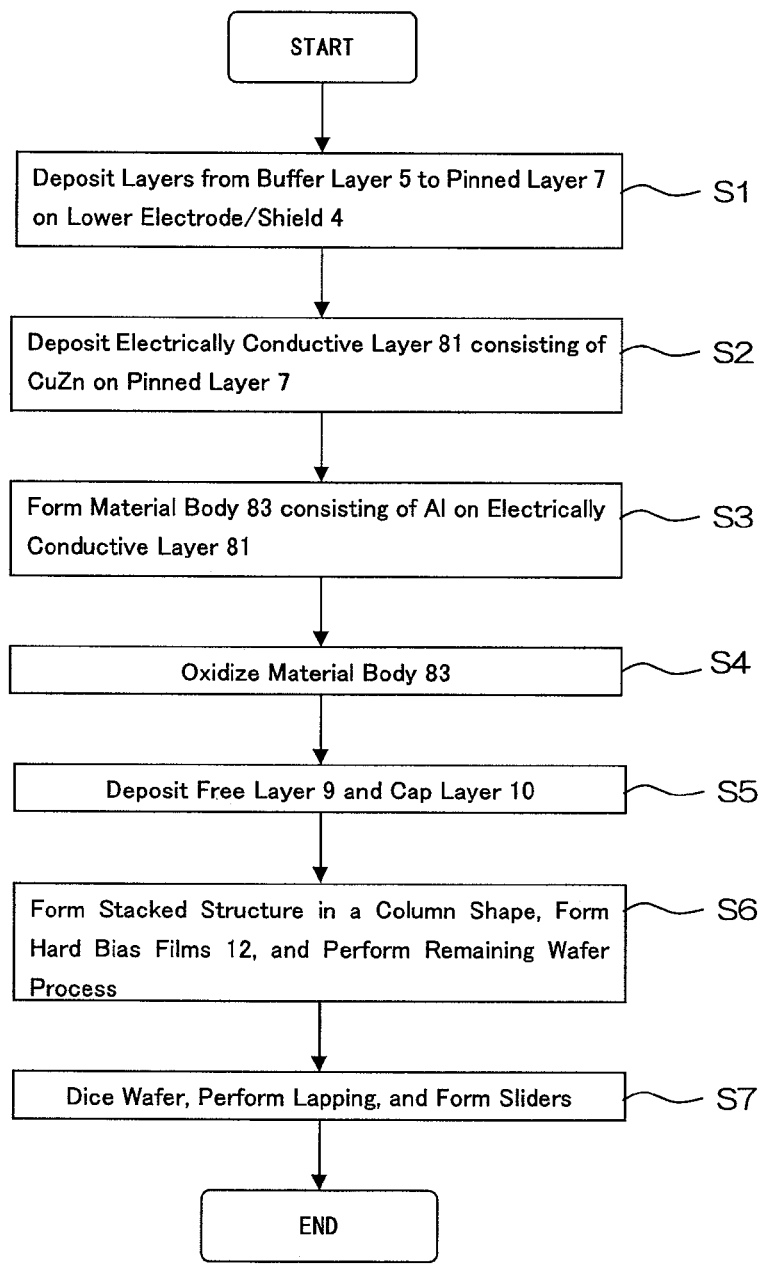
FIG. 4 is a flowchart showing a method for manufacturing the thin film magnetic head shown in FIG. 1.

Next, referring to the flowchart of FIG. 4, the method for manufacturing the thin film magnetic head described above will be described.

(Step S1)

First, lower electrode/shield 4 is formed on a substrate, not shown, that is made of a ceramic material, such as AlTiC ($Al_2O_3$.TiC), via an insulating layer, not shown. Subsequently, the layers beginning with buffer layer 5 and ending with pinned layer 7 are sequentially deposited by means of sputtering. When the CPP element of the top type is made, the free layer is deposited first.

(Step S2)

Figure 5A:
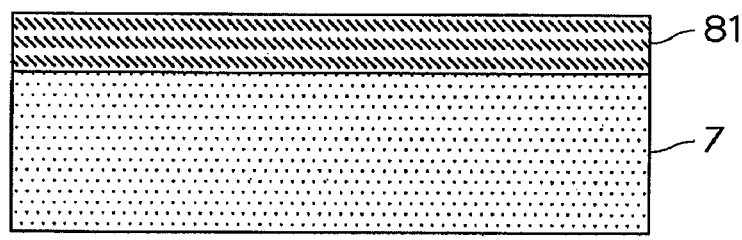
FIGS. 5A to 5C are step diagrams illustrating a method for manufacturing the thin film magnetic head shown in FIG. 1.

Next, as shown in FIG. 5A, electrically conductive layer 81, which consists of CuZn, is deposited on pinned layer 7 (or free layer 9) as part of spacer layer 8.

(Step S3)

Figure 5B:
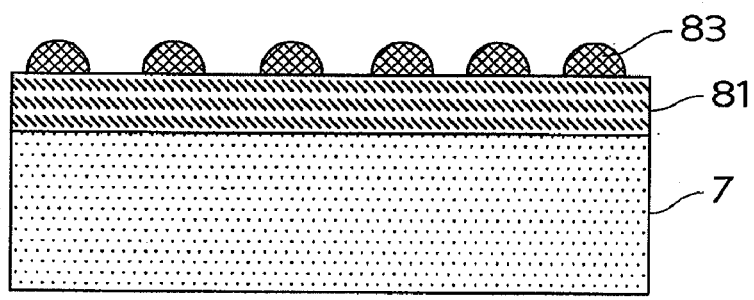

Next, as shown in FIG. 5B, material body 83 that consists of Al is formed on electrically conductive layer 81. Material body 83 may be any of Si, Cr, Ti, Hf, Zr, Zn, and Mg. The film thickness of the material body that is deposited is preferably no less than 0.1 nm and no more than 0.4 nm. This film thickness is a film thickness that is estimated in terms of mass using a deposition rate. It is thought that material body 83 that is deposited in the thickness described above is not formed in a complete continuous film, but actually formed in a dotted pattern. The inventors therefore think that material body 83 and electrically conductive layer 81 are both exposed when this step is completed, as shown in FIG. 5B.

(Step S4)

Figure 5C:
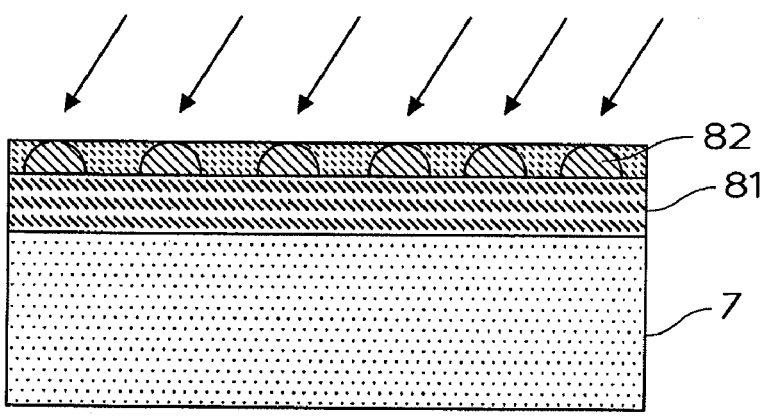

Next, as shown in FIG. 5C, material body 83 is oxidized so that oxide region 82, which consists of oxide of Al, is formed as part of the spacer layer. As described above, when any of Si, Cr, Ti, Hf, Zr, Zn, and Mg is used as material body 83, oxide of these materials is formed. The oxidation is preferably performed through exposure to oxygen or plasma oxidation. When the exposure to oxygen is used, the exposure is preferably performed at 0.67 mPa (0.005 mTorr) to 133 mPa (0.005 mTorr) for about 1 to 200 seconds. When the plasma oxidation is used, the exposure is preferably performed in an atmosphere of argon gas and $O_2$ for about 1 to 60 seconds. The inventors think that oxide region 82 made of Al is formed in a dotted pattern on the surface because Al is activated to allow CuZn to enter material body 83 of Al.

(Step S5)

Next, free layer 9 (or pinned layer 7) is formed on electrically conductive layer 81 that is provided with oxide region 82. The state at this stage is shown in FIG. 3. Subsequently, cap layer 10 is deposited on free layer 9.

(Step S6)

Next, the stacked structure of layers is patterned in a cylindrical shape, and then hard bias films 12 are formed on the side surfaces thereof, and the remaining portions are filled with an insulating layer. Subsequently, upper electrode/shield 3 is formed to complete the read head portion of the thin-film magnetic head, as illustrated in FIG. 2. A write magnetic pole layer and a coil are further formed if a write head portion is required. Subsequently, the entire structure is covered with a protection layer.

(Step S7)

Next, the wafer is diced, lapped, and separated into a stacked structure (slider) in which the thin-film magnetic head is formed.

Second Embodiment

Figure 6:
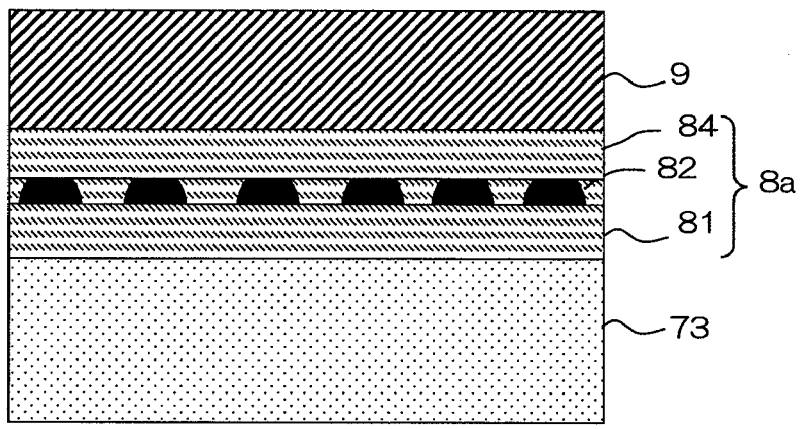
FIG. 6 is an enlarged view of the spacer portion of the thin film magnetic head according a second embodiment of the present invention.

In the first embodiment described above, second electrically conductive layer 84 that consists of CuZn may further be formed on electrically conductive lager 81, which is provided with oxide region 82, as part of spacer layer 8, as shown in FIG. 6. Since the resistance of spacer layer 8a is increased and the ratio of parasitic resistance is decreased, further improvement of the MR ratio is possible. Specifically, after Step S4 and prior to S5, which is described above, second electrically conductive layer 84 that consists of CuZn is deposited on electrically conductive layer 81 in which oxide region 82 of Al oxide is formed in a dotted pattern. The film thickness of second electrically conductive layer 84 is preferably no less than 0.1 nm and no more than 4 nm, and more preferably no less than 0.2 nm and no more than 4 nm. If free layer 9 is deposited without second electrically conductive layer 84 being provided, then free layer 9 is directly deposited on electrically conductive layer 81 in which oxide region 82 is formed. If second electrically conductive layer 84 is formed in contact with free layer 9, as in the present embodiment, free layer 9 is formed on a more flat layer, and therefore, the roughness of free layer 9 is improved. This contributes to the improvement of the MR ratio.

Next, proper layer configuration of the spacer layer of the thin film magnetic head described above was studied based on experiments. The CPP element was formed by the method described above. The patterning size was set to be 0.2 μm φ.

EXPERIMENT 1

Figure 7:
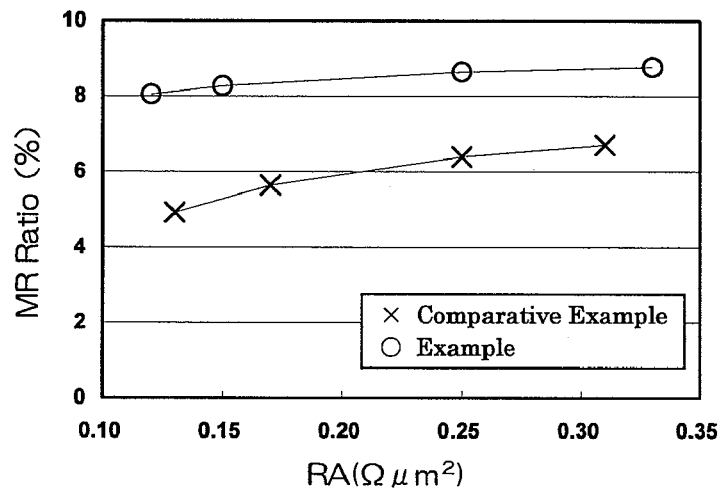
FIG. 7 is a graph showing a relationship between the RA value and the MR ratio.

First, the MR ratio of the CPP element that uses CuZn for electrically conductive layer 81 of spacer layer 8 was measured. As a comparative example, the MR ratio was also measured for an element that uses Cu for electrically conductive layer 81. The layer configuration is shown in Table 2. In both examples, plasma oxidation was used after the CuZn layer (or Cu layer) and material body 83 that is made of Al were deposited. Various RA values were used by changing the oxidation condition in order to study whether or not a large MR ratio is obtained in the range of proper RA value. The upper limit of the proper RA value is about $0.35(\Omega\ \mu m^2)$, as described above. Since a small RA value may cause an increase in spin torque which may affect the response of the free layer, the RA value is preferably equal to or larger than $0.1(\Omega\ \mu m^2)$. In conclusion, the range of proper RA value is equal to or larger than $0.1(\Omega\ \mu m^2)$ and equal to or smaller than $0.35(\Omega\ \mu m^2)$. As shown in FIG. 7, the experiment substantially covers this range of the RA value. As a result of the experiment, it was found that larger MR ratios were obtained in the substantially entire range of the proper RA value as compared with the comparative example.

EXPERIMENT 2

Figure 8:
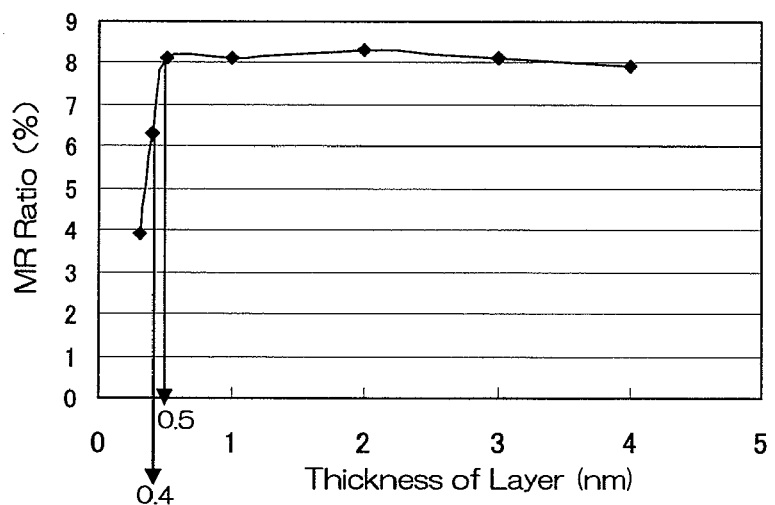
FIG. 8 is a graph showing a relationship between the film thickness of the electrically conductive layer and the MR ratio.

Next, the effect of the film thickness of electrically conductive layer 81 on the MR ratio was studied using the layer configuration shown in Table 2. The RA value was set to be $0.15(\Omega\ \mu m^2)$ by adjusting the oxidation condition. The layer configuration and the result are shown in Table 3 and in FIG. 8, respectively. When film thickness x is less than 0.4 nm, a sufficient MR ratio was not obtained. This is probably because the electrically conductive layer was not uniformly formed. When film thickness x of the electrically conductive layer is 0.4 nm or more, the MR ratio was effectively increased. The MR ratio was 6.3% when film thickness x was 0.4 nm. For reference, a MR ratio of 5.6% was obtained for an element that was made under the same conditions except for the electrically conductive layer being made of Cu. When film thickness x of the electrically conductive layer was 0.5 nm or more, a MR ratio that was as large as 8% or more was obtained. Accordingly, the film thickness of the electrically conductive layer is preferably 0.4 nm or more, and more preferably is 0.5 nm or more. On the other hand, when film thickness x exceeds 0.5 nm, the change in the MR ratio is limited. This is probably because spin information is not significantly lost within the range of the film thickness for which the experiment was performed because Cu60Zn40 has a sufficiently long spin diffusion length despite the large film thickness. However, it is preferable that the film thickness of electrically conductive layer 81 be as small as possible because a narrow gap between lower electrode/shield 4 and upper electrode/shield 3 is desired for high recording density. Therefore, the film thickness of the electrically conductive layer is preferably 4 nm or less, which is the upper limit of the experiment.

TABLE 3

| Layer Configuration after deposition | | Composition | Layer Thickness (nm) |
|---|---|---|---|
| Cap Layer 10 | | Ru | 2 |
| FreeLayer 9 | | CoFe | 4 |
| Spacer Layer 8 | Marerial Layer 82 | Al | 0.3 |
| | Electrically Conductive Layer 81 | Cu60Zn40 | x |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

EXPERIMENT 3

Next, the effect of the atomic fraction of Zn in CuZn on the MR ratio was studied. The RA value was set to be 0.15(Ω

TABLE 2

Figure 9:
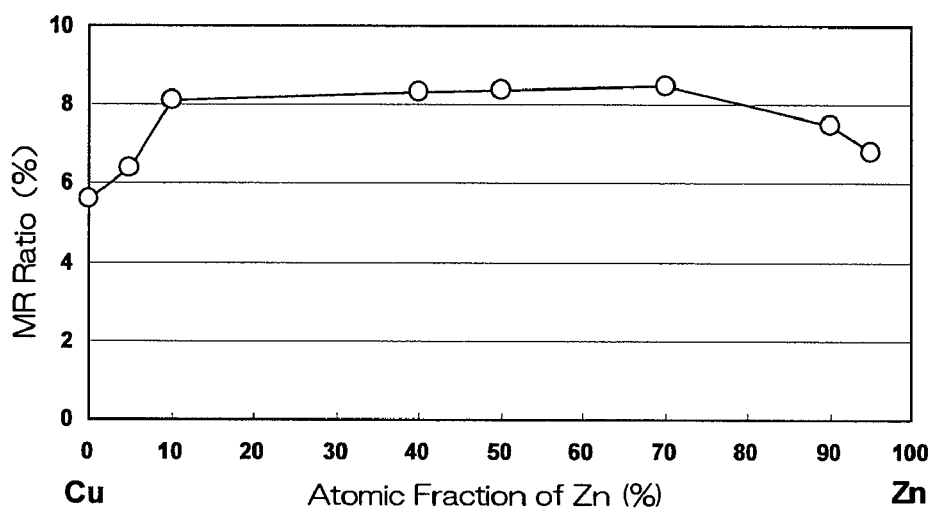
FIG. 9 is a graph showing a relationship between the atomic fraction of Zn and the MR ratio.

| Layer Configuration after deposition | | Composition | Layer Thickness (nm) |
|---|---|---|---|
| Cap Layer 10 | | Ru | 2 |
| FreeLayer 9 | | CoFe | 4 |
| Spacer Layer 8 | Marerial Layer 82 | Al | 0.3 |
| | Electrically Conductive Layer 81 | (Example)Cu60Zn40 | 2 |
| | | (Comparative Example)Cu | 2 |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

μm$^2$) by adjusting the oxidation condition. The layer configuration and the result are shown in Table 4 and in FIG. 9, respectively. It is found that the MR ratio is increased in a wide range of the atomic fraction of Zn. There is not a large limitation regarding the atomic fraction of Zn, and the atomic fraction of Zn can be selected from a range that is no less than 5% and no more than 95%. However, the ratio of the atomic fraction of Zn to CuZn of no less than 10% and no more than 70% is particularly preferable.

TABLE 4

| Layer Configuration after deposition | | Composition | Layer Thickness (nm) |
|---|---|---|---|
| Cap Layer 10 | | Ru | 2 |
| FreeLayer 9 | | CoFe | 4 |
| Spacer Layer 8 | Marerial Layer 82 | Al | 0.3 |
| | Electrically Conductive Layer 81 | Cu$_{100-x}$Zn$_x$ | 2 |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

EXPERIMENT 4

Figure 10:
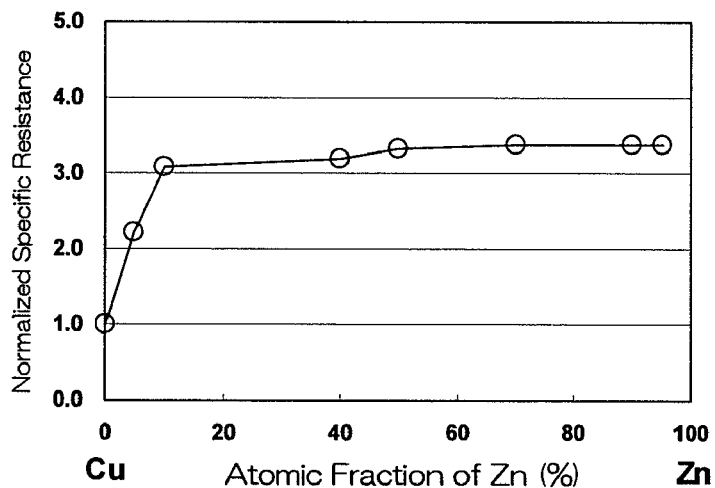
FIG. 10 is a graph showing a relationship between the atomic fraction of Zn and specific resistance of a CuZn layer.

Next, the effect of the atomic fraction of Zn in CuZn on the specific resistance of a CuZn layer was studied. A CuZn layer in a single layer was prepared in order to exclude the effect of other layers. The film thickness was set to be 46 nm. The result is shown in FIG. 10. The specific resistance is normalized. The specific resistance is increased as compared with a single Cu layer (x=0) by adding only a slight amount of Zn, but the specific resistance saturates when the atomic fraction is approximately 10%. This result corresponds well to the result of Experiment 3. From the test result, it was confirmed that the specific resistance, and accordingly the MR ratio were improved by adding Zn. The reason why the MR ratio is gradually decreased when x is more than 70% in Experiment 3 is that it becomes more and more difficult to ensure a sufficiently large spin diffusion length as the electrically conductive layer comes to resemble the characteristics of a Zn single layer.

EXPERIMENT 5

Figure 11:
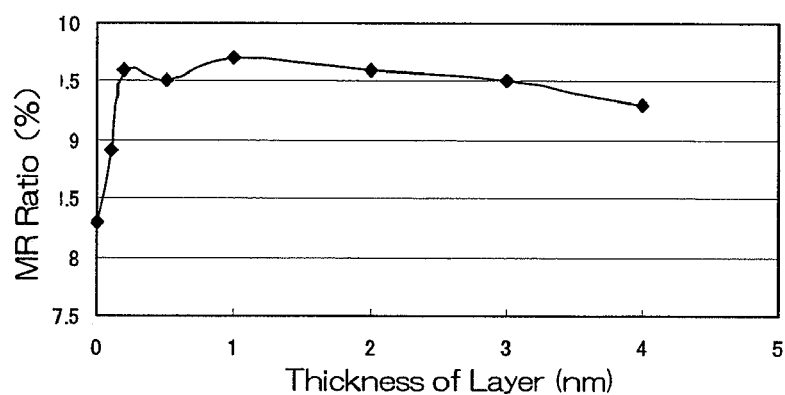
FIG. 11 is a graph showing a relationship between the film thickness of the second electrically conductive layer and the MR ratio.

Next, the effect of the film thickness of the second electrically conductive layer on the MR ratio was studied in order to evaluate the effectiveness of the second electrically conductive layer in the second embodiment. The layer configuration and the result are shown in Table 5 and in FIG. 11, respectively. It is confirmed that a further increase in the MR ratio was achieved only by adding the second electrically conductive layer 84 having a thickness of 0.1 nm. The MR ratio was further increased when the film thickness was 0.2 or more. As described above, this is probably because the roughness of the second electrically conductive layer 84 and free layer 9 was improved by adding second electrically conductive layer 84.

TABLE 5

| Layer Configuration after deposition | | Composition | Layer Thickness (nm) |
|---|---|---|---|
| Cap Layer 10 | | Ru | 2 |
| FreeLayer 9 | | CoFe | 4 |

TABLE 5-continued

| Layer Configuration after deposition | | Composition | Layer Thickness (nm) |
|---|---|---|---|
| Spacer Layer 8 | Second Electrically Conductive Layer 84 | Cu60Zn40 | x |
| | Marerial Layer 82 | Al | 0.3 |
| | Electrically Conductive Layer 81 | Cu60Zn40 | 2 |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

EXPERIMENT 6

Figure 12:
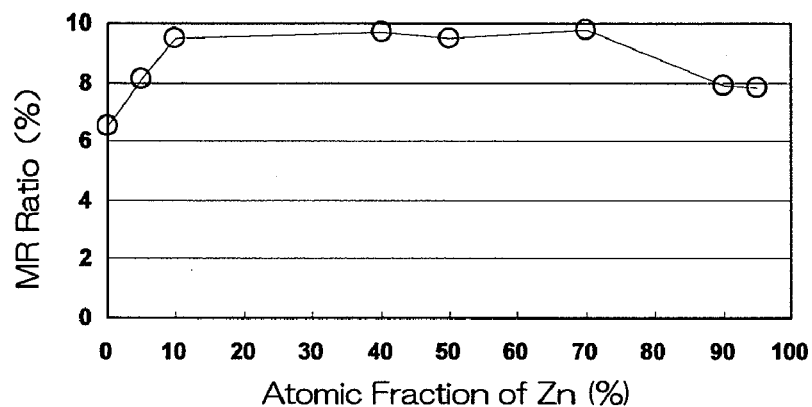
FIG. 12 is a graph showing a relationship between the atomic fraction of Zn in the second electrically conductive layer and the MR ratio.

Next, the effect of the atomic fraction of Zn in second electrically conductive layer 84 on the MR ratio was studied when the film thickness of Zn of second electrically conductive layer 84 was 1 nm. The RA value was set to be 0.15(Ω μm$^2$) by adjusting the oxidation condition. The layer configuration and the result are shown in Table 6 and in FIG. 12, respectively. There is not a large limitation regarding the atomic fraction of Zn, and the atomic fraction of Zn can be selected from a range that is no less than 5% and no more than 95%. However, the ratio of the atomic fraction of Zn to CuZn of no less than 10% and no more than 70% is particularly preferable.

TABLE 6

| Layer Configuration after deposition | | Composition | Layer Thickness (nm) |
|---|---|---|---|
| Cap Layer 10 | | Ru | 2 |
| FreeLayer 9 | | CoFe | 4 |
| Spacer Layer 8 | Second Electrically Conductive Layer 84 | Cu$_{1-z}$Zn$_z$ | 1 |
| | Marerial Layer 82 | Al | 0.3 |
| | Electrically Conductive Layer 81 | Cu60Zn40 | 2 |
| Pinned Layer 7 | Inner Pinned Layer 73 | CoFe | 3.5 |
| | Spacer Layer 72 | Ru | 0.8 |
| | Outer Pinned Layer 71 | CoFe | 3 |
| Antiferromagnetic Layer 6 | | IrMn | 6 |
| Buffer Layer 5 | | NiCr | 4 |
| | | Ta | 1 |

Figure 13:
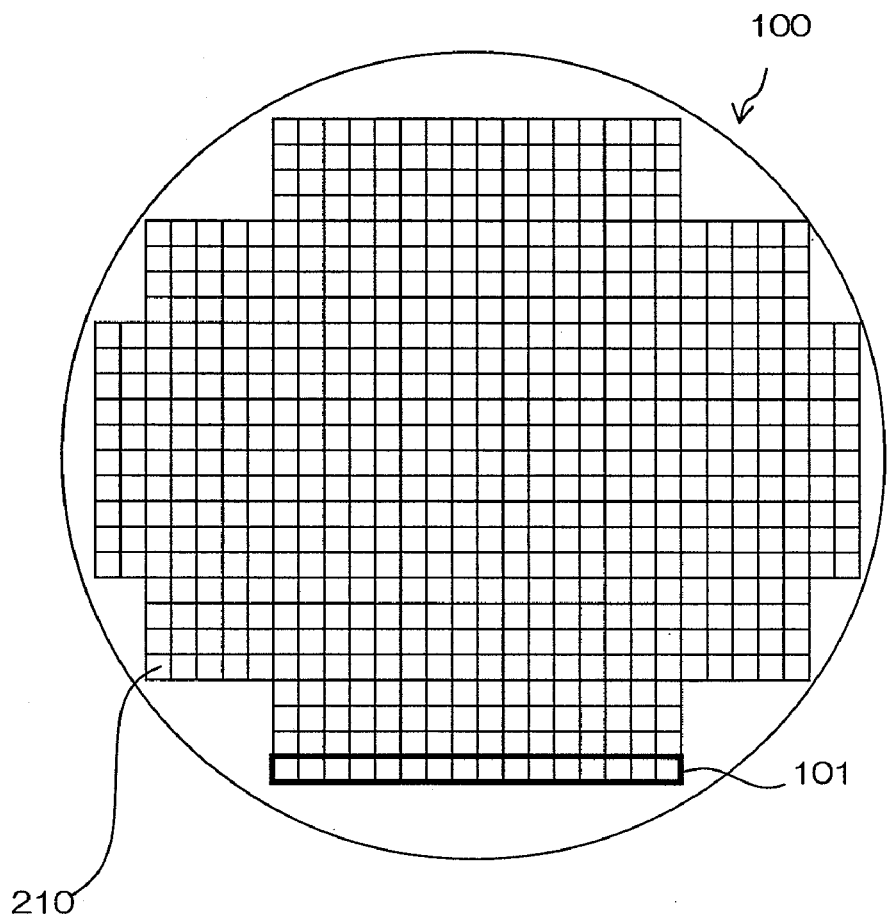
FIG. 13 is a plan view of a wafer which is used to manufacture a thin film magnetic head of the present invention.

Next, explanation will be made regarding a wafer for fabricating a thin-film magnetic head described above. Referring to FIG. 13, wafer 100 has SV 2 that includes magnetic thin film 15 mentioned above which are deposited thereon. Wafer 100 is diced into bars 101 which serve as working units in the process of forming air bearing surface ABS. After lapping, bar 101 is diced into sliders 210 which include thin-film magnetic heads 1. Dicing portions, not shown, are provided in wafer 100 in order to dice wafer 100 into bars 101 and into sliders210.

Figure 14:
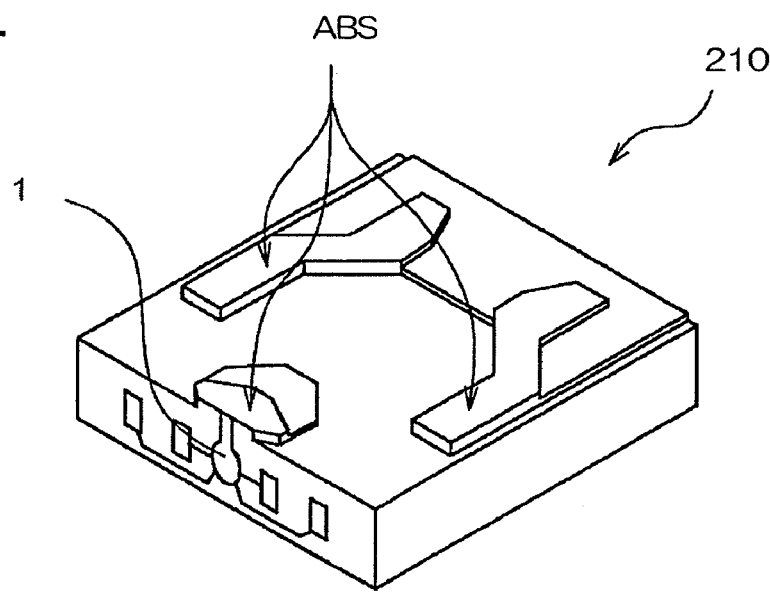
FIG. 14 is a perspective view of a slider of the present invention.
Figure 14:
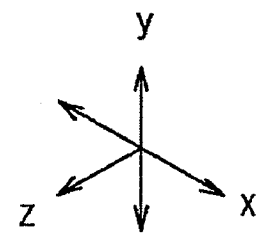

Referring to FIG. 14, slider 210 has a substantially hexahedral shape. One of the six surfaces of slider 210 forms air bearing surface ABS, which is positioned opposite to the hard disk.

Figure 15:
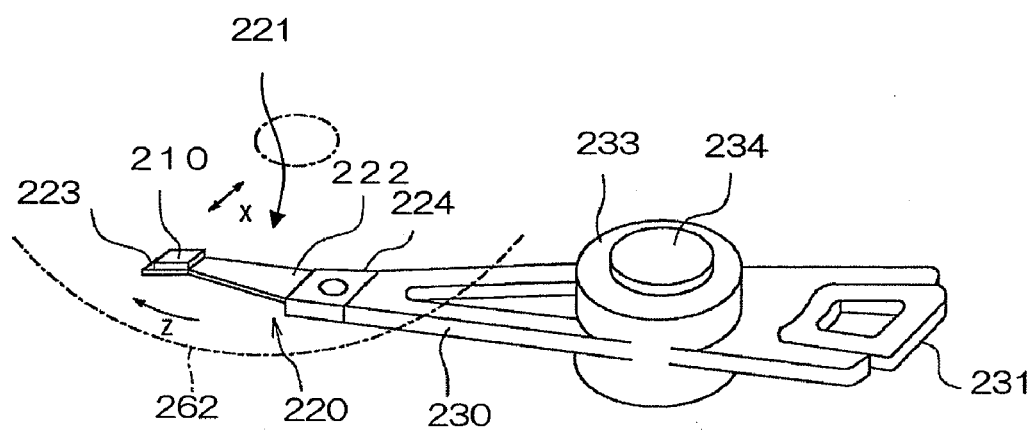
FIG. 15 is a perspective view of a head arm assembly which includes a head gimbal assembly which incorporates a slider of the present invention.

Referring to FIG. 15, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 15, airflow which passes between the hard disk and slider 210 creates a dynamic lift, which is applied to slider 210 downward in the y direction. Slider 210 is configured to lift up from the surface of the hard disk due to this dynamic lift effect. Thin-film magnetic head 1 is formed in proximity to the trailing edge (the end portion at the lower left in FIG. 14) of slider 210, which is on the outlet side of the airflow.

The arrangement in which a head gimbal assembly 220 is attached to arm 230 is called a head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 16:
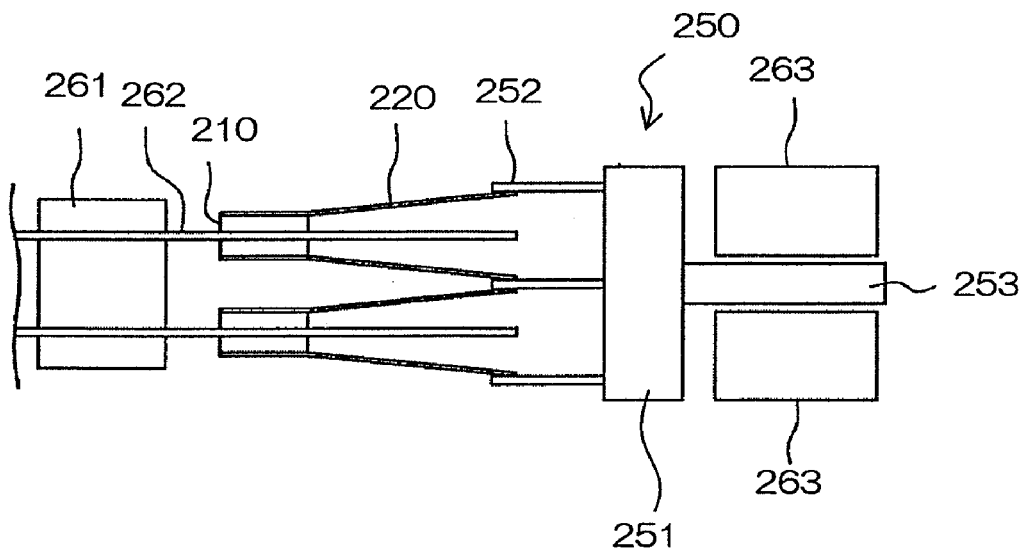
FIG. 16 is a side view of a head arm assembly which incorporates sliders of the present invention.
Figure 17:
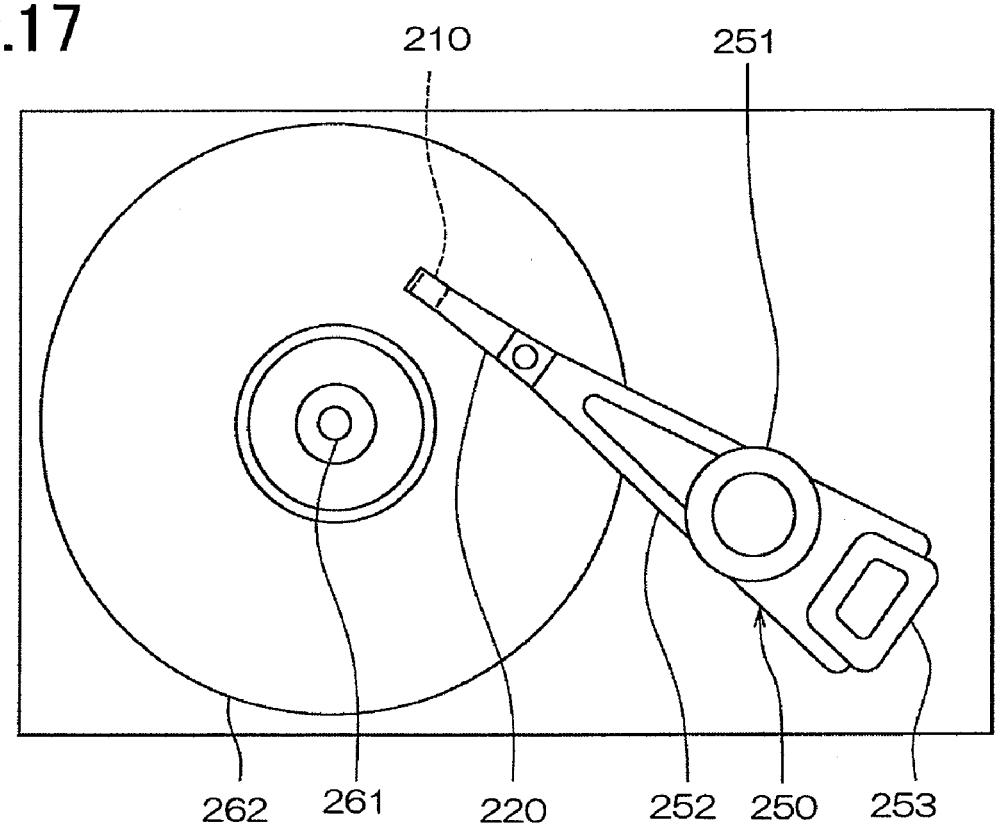
FIG. 17 is a plan view of a hard disk drive which incorporates sliders of the present invention.

Referring to FIG. 16 and FIG. 17, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 16 is a side view of a head stack assembly, and FIG. 17 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 17, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

What is claimed is:

1. A magnetic thin film, comprising:
   a pinned layer whose magnetization direction is fixed with respect to an external magnetic field;
   a free layer whose magnetization direction is changed according to the external magnetic field; and
   a spacer layer which is sandwiched between said pinned layer and said free layer,
   wherein sense current is configured to flow in a direction that is perpendicular to film surfaces of said pinned layer, said spacer layer, and said free layer; and
   wherein said spacer layer comprises a CuZn metal alloy region consisting of Cu and Zn and an oxide region, said oxide region consisting of an oxide selected from the group consisting of Al, Ti, and Mg.

2. The magnetic thin film according to claim 1, wherein an atomic fraction of Zn in said CuZn metal alloy region is no less than 5% and no more than 95%.

3. The magnetic thin film according to claim 1, wherein an atomic fraction of Zn in said CuZn metal alloy region is no less than 10% and no more than 70%.

4. A thin film magnetic head, comprising:
   a stacked structure of layers which includes said magnetic thin film according to claim 1; and
   a pair of electrodes for supplying said sense current to said stacked structure, wherein said pair of electrodes sandwich said stacked structure.

5. The thin film magnetic head according to claim 4, wherein a product of electric resistance of said stacked structure to said sense current and a minimum sectional area of said stacked structure, the minimum cross sectional area being taken in a plane that is parallel to said film surfaces of said stacked structure is no less than 0.1 Ω μm$^2$ and no more than 0.35 Ω μm$^2$.

6. A slider comprising said thin film magnetic head according to claim 4.

7. A head gimbal assembly comprising:
   said slider according to claim 6, and
   a suspension for resiliently supporting said slider.

8. A hard disk drive comprising:
   said slider according to claim 6, and
   a device for supporting said slider and for positioning said slider with respect to a recording medium.

9. A wafer on which said magnetic thin film of claim 1 is formed.

10. A method for manufacturing a magnetic thin film, according to claim 1, comprising the steps of:
    forming either said pinned layer or said free layer;
    forming an electrically conductive layer which consists of a CuZn metal alloy on said magnetic layer as part of said spacer layer;
    forming a material body on said electrically conductive layer, said material body consisting of any of Al, Ti, and Mg;
    oxidizing said material body and forming an oxide region as part of said spacer layer, said oxide region consisting of oxide of any of Al, Ti, and Mg; and
    forming the other said pinned layer or free layer on said electrically conductive layer which is provided with said oxide region.

11. The method for manufacturing the magnetic thin film according to claim 10, wherein an atomic fraction of Zn in said CuZn metal alloy is no less than 5% and no more than 95%.

12. The method for manufacturing the magnetic thin film according to claim 10, wherein an atomic fraction of Zn in said CuZn metal alloy is no less than 10% and no more than 70%.

13. The method for manufacturing the magnetic thin film according to claim 10, wherein a film thickness of said electrically conductive layer is no less than 0.4 nm and no more than 4 nm.

14. The method for manufacturing the magnetic thin film according to claim 10, wherein a film thickness of said electrically conductive layer is no less than 0.5 nm and no more than 4 nm.

15. The method for manufacturing the magnetic thin film according to claim 10, wherein the step of forming said material body includes depositing said material body having a mass that corresponds to a film thickness of no less than 0.1 nm and no more than 0.4 nm on said electrically conductive layer.

16. The method for manufacturing the magnetic thin film according to claim 10, wherein the step of forming said oxide region includes exposure to oxygen or plasma oxidation.

17. The method for manufacturing the magnetic thin film according to claim 10, further comprising the step of forming a second electrically conductive layer on said electrically conductive layer as part of said spacer layer, wherein said electrically conductive layer is provided with said oxide region, and wherein said second electrically conductive layer consists of a CuZn metal alloy.

18. The method for manufacturing the magnetic thin film according to claim 17, wherein an atomic fraction of Zn in said second electrically conductive layer is no less than 5% and no more than 95%.

19. The method for manufacturing the magnetic thin film according to claim 17, wherein an atomic fraction of Zn in said second electrically conductive layer is no less than 10% and no more than 70%.

20. The method for manufacturing the magnetic thin film according to claim 17, wherein the step of forming said second electrically conductive layer includes depositing a CuZn metal alloy having a thickness of no less than 0.1 nm and no more than 4 nm.

21. The method for manufacturing the magnetic thin film according to claim 17, wherein the step of forming said second electrically conductive layer includes depositing a CuZn metal alloy having a thickness of no less than 0.2 nm and no more than 4 nm.

* * * * *